United States Patent [19]

Kodama et al.

[11] Patent Number: 4,799,197
[45] Date of Patent: Jan. 17, 1989

[54] SEMICONDUCTOR MEMORY DEVICE HAVING A CMOS SENSE AMPLIFIER

[75] Inventors: Yukinori Kodama, Yokohama; Hirohiko Mochizuki, Kawasaki; Masao Nakano, Kasugai; Tsuyoshi Ohira, Kawasaki; Hidenori Nomura, Yokohama, all of Japan

[73] Assignees: Fujitsu Limited, Kanagawa; Fujitsu VLSI Limited, Aichi, both of Japan

[21] Appl. No.: 91,795

[22] Filed: Sep. 1, 1987

[30] Foreign Application Priority Data

Sep. 2, 1986 [JP] Japan .................... 61-206439

[51] Int. Cl.⁴ .................... G11C 7/00; G11C 11/24
[52] U.S. Cl. .................... 365/205; 365/149
[58] Field of Search ................ 365/149, 190, 203, 205

[56] References Cited

U.S. PATENT DOCUMENTS

| 4,363,111 | 12/1982 | Heightley et al. | 365/205 |
| 4,366,559 | 12/1982 | Misaizu et al. | 365/205 |
| 4,606,010 | 8/1986 | Saito | 365/149 |

FOREIGN PATENT DOCUMENTS

| 0027169 | 4/1981 | European Pat. Off. |
| 0178921 | 4/1986 | European Pat. Off. |
| 0182719 | 5/1986 | European Pat. Off. |
| WO80/01730 | 8/1980 | PCT Int'l Appl. |
| WO81/03572 | 12/1981 | PCT Int'l Appl. |

OTHER PUBLICATIONS

1984 IEEE International Solid-State Circuits Conference, Feb. 24, 1984, pp. 278, 279.
Electronics, Jun. 14, 1984, AMR Mohsen et al., "C-MOS 256-K RAM", pp. 138–143.
1984 IEEE International Solid-State Circuits Conference, Feb. 22, 1984, pp. 104–105.

Primary Examiner—James W. Moffitt
Attorney, Agent, or Firm—Armstrong, Nikaido, Marmelstein & Kubovcik

[57] ABSTRACT

A semiconductor memory device comprises a memory cell array comprising memory cells: a plurality of pairs of bit lines which are coupled to the memory cells and a data bus, each bit line being divided into at least two pairs of bit line parts; at least one sense amplifier provided between the pairs of bit line parts in each of the pairs of bit lines, for sensing a difference in potential between bit line parts in each pair, the sense amplifier being formed with complementary metal oxide semiconductor transistors; and at least a pair of transfer gates provided between a non-data bus side and a data bus side of the sense amplifier, the pair of transfer gates being held in an off-state when the sense amplifier is activated.

6 Claims, 4 Drawing Sheets

SEMICONDUCTOR MEMORY DEVICE HAVING A CMOS SENSE AMPLIFIER

BACKGROUND OF THE INVENTION

The present invention generally relates to a semiconductor memory device, and in particular to a semiconductor memory device such as a dynamic random access memory (DRAM) comprising one-transistor cell type memory cells. The present invention more particularly relates to a divided bit line type semiconductor memory device.

A semiconductor memory device such as a dynamic random access memory (hereafter abbreviated as DRAM) generally includes a memory cell array, a row decoder, a column decoder, an input/output (hereafter referred to as I/O) gate, a data bus and a sense amplifier. The cell array is configured by arranging memory cells each consisting of a transistor Q and a capacitor C at cross-points of word lines and bit lines. The row decoder selects one of the word lines corresponding to a row address supplied by an external circuit. The column decoder outputs a signal for selecting a pair of bit lines corresponding to a column address supplied by an external circuit. The I/O gate connects the gate corresponding to the pair of bit lines designated by the column decoder to the data bus. The sense amplifier senses and amplifies a difference in potential between the pair of bit lines.

The bit lines in the DRAM are generally formed with a plurality of pairs of bit lines. As well known, there are two types of pairs of bit lines, one of which is an open bit line type and the other is a folded bit line type. In the open bit line configuration, two bit lines forming one pair each extend from opposing sides of the sense amplifier, whereas in the folded bit line configuration, both the bit lines forming the pair extend from the same side of the sense amplifier.

Although the DRAM thus configured has advantages of a simple structure and a high integration density, it has the following disadvantages. That is, as the storage capacity increases, memory cells are minimized and correspondingly the capacity of the cell capacitor decreases. In this case, a C-ratio, which is defined as a ratio of the capacitance $C_{BL}$ of the bit line to the capacitance $C_{CELL}$ of the cell capacitance, is increased (degraded) as the memory cells are minimized, because the read-out operation of the DRAM depends on a distribution of the capacitance between the bit line and the memory cell. Therefore, it becomes difficult to generate the difference in potential between the pair of the bit lines. In addition, it becomes difficult to obtain a desired amplifying operation of the sense amplifier.

Hence, there has been proposed a solution that the bit lines are divided into two or more parts to thereby improve the C-ratio. The capacitance of each of the divided bit lines becomes $\frac{1}{2}$, $\frac{1}{4}$, ..., as the bit lines are divided into two, four, ..., so that the C-ratio can be decreased (improved). In addition, the division of the bit lines enables the sense amplifier to rapidly amplify the difference in potential between the pair of the bit lines, which makes possible a high-speed reading-out operation of the DRAM.

In the divided bit line type DRAM aforementioned, the sense amplifier positioned between adjacent pairs of divided bit lines is generally a flip-flop which is formed with n- or p-channel metal oxide semiconductor (hereafter referred to MOS) transistors. This means that the use of complementary MOS (hereafter referred to as CMOS) transistors has not yet been proposed in the divided bit line type DRAM. It should be noted that as will be shown later, a CMOS sense amplifier itself has been proposed in configurations other than the divided bit line type. However, as will be described later, a mere replacement of the sense amplifier formed with n- or p-channel transistors with the proposed one formed with CMOS transistors leads to problems of large power consumption.

SUMMARY OF THE INVENTION

Accordingly, it is a general object of the present invention to provide a novel and effective semiconductor memory device, in which a sense amplifier positioned adjacent to pairs of divided bit lines is formed with CMOS transistors.

It is a more specific object of the present invention to provide a semiconductor memory device in which the power consumption generated in a sense amplifier formed with CMOS transistors is extremely reduced.

To attain the above-mentioned objects, according to the present invention, there is provided a semiconductor memory device comprising a memory cell array comprising memory cells; a plurality of pairs of bit lines which are coupled to the memory cells and a data bus, each bit line being divided into at least two pairs of bit line parts; at least one sense amplifier provided between the pairs of bit line parts in each of the pairs of bit lines, for sensing a difference in potential between bit line parts in each pair, the sense amplifier being formed with complementary metal oxide semiconductor transistors; and at least one pair of transfer gates provided on a non-data bus side and a data bus side of the sense amplifier, the pair of transfer gates being held in an-off state when the sense amplifier is activated.

Other objects and further features of the present invention will be apparent from the following detailed description when read in conjunction with the attached drawings.

DETAILED DESCRIPTION

A description will first be given of a general configuration of a semiconductor memory device forming DRAM with reference to FIGS. 1A, 1B and 2.

Figure 1A:
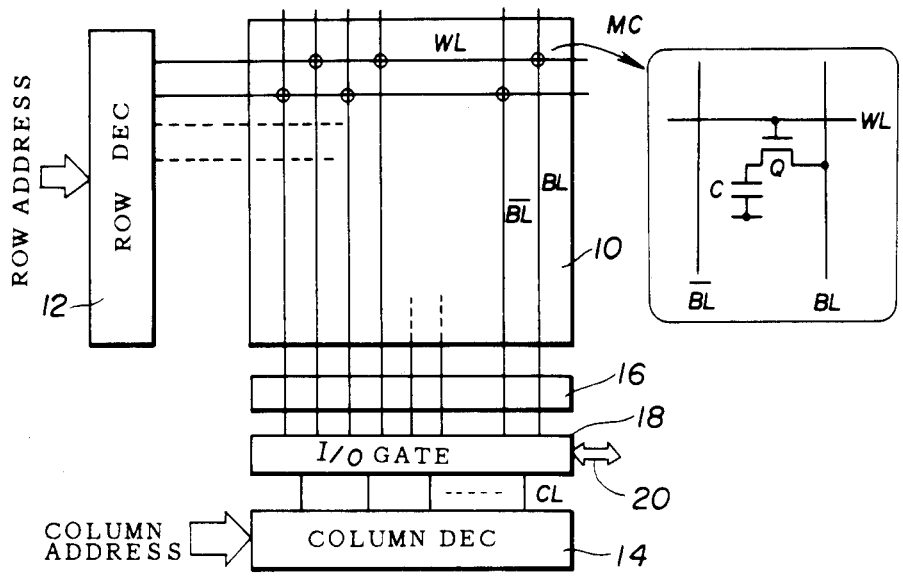
FIG. 1A is a block diagram of one example of a dynamic random access memory.

FIG. 1A shows a configuration of a folded bit line type DRAM. A DRAM mainly includes a memory cell array 10, a row decoder 12, a column decoder 14, a sense amplifier 16 and, gate 18 and a data bus 20. The cell array 10 has memory cells MC each consisting of a MOS transistor and a capacitor. The memory cells are arranged at every other cross-point of word lines WL and bit lines BL ($\overline{BL}$). The row decoder 12 selects one of the word lines WL corresponding to a row address applied thereto by a row counter (not shown). The column decoder 14 selects one pair of bit lines BL and $\overline{BL}$ corresponding to a column address supplied thereto by a column counter. The sense amplifier 16 senses and amplifies the difference in potential between the pair of bit lines BL and $\overline{BL}$. All the pairs of bit lines BL and $\overline{BL}$ are connected to the I/O gate 18, which is coupled to a data bus 20.

The sense amplifier 16 in the configuration in FIG. 1A may be formed with CMOS transistors, which is disclosed in J. Yamada et al, "A Submicron VLSI Memory with a 4b-at-Time Built-in ECC Circuit", ISSCC DIGEST OF TECHNICAL PAPERS, pp. 104–105, Feb., 22, 1984, for example.

When reading out a datum from a certain memory cell MC, the corresponding word line WL is selected by the row decoder 12. Then, all the storage data belonging to the selected word line WL appear on either the bit line BL or $\overline{BL}$. These data are sensed and amplified by the sense amplifier 16 and one of the data which is selected by a select signal CL provided by the column decoder 14 is supplied to the data bus 20 through the I/O gate 18. On the other hand, when writing a datum in a certain memory cell MC, a writing data is inputted to the I/O gate 18 through the data bus 20. The I/O gate 18 opens one of the gates corresponding to the pair of the bit lines in response to the select signal CL supplied by the column decoder 14. Then, the row decoder 12 selects one word line WL. Therefore, the data stored in a memory cell MC belonging to the selected word line WL and the either one of bit lines BL and $\overline{BL}$ is changed to the new writing data.

As described in the foregoing, the pairs of bit lines BL and $\overline{BL}$ may each be divided into a plurality of bit line parts in order to improve the C-ratio. FIG. 1B shows a configuration of a divided bit line type DRAM. As shown in this figure, all the bit lines BL and $\overline{BL}$ are divided into two bit line parts at the center of the cell array 10, and there is provided the sense amplifier 16 at the divided point.

Figure 2:
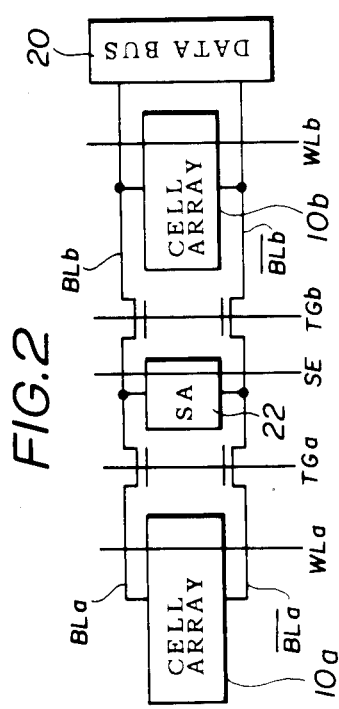
FIG. 2 is a block diagram of a configuration associated with one pair of a plurality of pairs of bit lines shown in FIG. 1B.

FIG. 2 illustrates a configuration associated with one pair of a plurality of pairs of bit lines BL and $\overline{BL}$. The pair of the bit lines BL and $\overline{BL}$ are divided into a pair of bit lines BLa and $\overline{BLa}$ and a pair of bit lines BLb and $\overline{BLb}$. A sense amplifier 22, which is a part of the sense amplifier 16 relative to the pair of the bit lines BL and $\overline{BL}$ illustrated in FIG. 2, is arranged at the divided point. The sense amplifier 22 is enabled or disabled according to a signal on an enable signal line SE. A transfer gate TGa is provided between the pair of bit lines BLa and $\overline{BLa}$. Also, a transfer gate TGb is provided between the pair of bit lines BLb and $\overline{BLb}$. In the following description, each of characters TGa and TGb denotes the transfer gate itself or its control signal line.

Figure 1B:
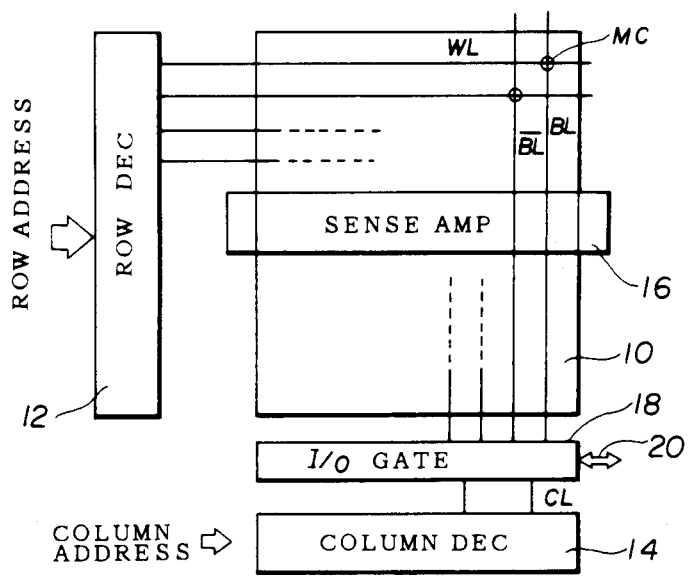
FIG. 1B is a block diagram of another example of a dynamic random access memory, in which bit lines are each divided into two parts.

The cell array illustrated in FIG. 1B is also divided into a cell array 10a positioned on the left side of the sense amplifier 22 (non-data bus side) and a cell array 10b at the right side thereof (data bus side), corresponding to the division of the bit lines BL and $\overline{BL}$. Each of the memory cells in the cell array 10a is coupled to either the bit line BLa or $\overline{BLa}$. Likewise, each of the memory cells in the cell array 10b is coupled to either the bit line BLb or $\overline{BLb}$. The memory cells in the cell arrays 10a and 10b are coupled to a plurality of word lines. However, for simplicity of the drawing, only one word line WLa relative to the cell array 10a and only one word line WLb relative to the cell array 10b are illustrated in FIG. 2. Of course, the other pairs of bit lines have the same constitution as the bit lines illustrated.

Figure 3:
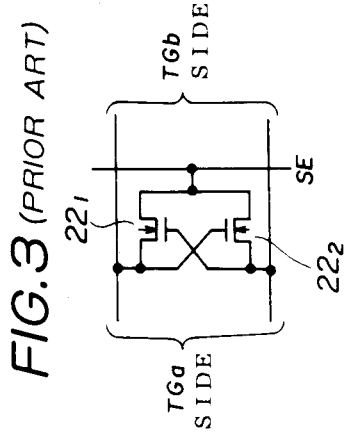
FIG. 3 is a circuit diagram of a conventional sense amplifier used in a dynamic random access memory.

FIG. 3 is a circuit diagram of a conventional configuration of the sense amplifier 22 used in the divided bit line type DRAM. As shown, the sense amplifier 22 is a flip-flop composed of two n-channel MOS transistors. A pair of input terminals of the flip-flop are respectively connected to the pair of bit lines. This kind of the configuration of the sense amplifier is disclosed in A. Mohsen et al, "C-MOS 256-K RAM with wideband output stands by on microwatts", Electronics, pp. 138–143, Jun. 1984, for example.

A read-out operation of data in the divided bit line type DRAM aforementioned is performed as follows. When, selecting a memory cell in the cell array 10a on the non-data bus side viewed from the sense amplifier 22, the corresponding word line is selected in a state where the transfer gates TGa and TGb are in on- and off-states, respectively. For example, the word line WLa is selected, the storage datum belonging to the word line WLa appears on either bit line BLa or $\overline{BLa}$, and a small difference in potential between the bit lines BLa and $\overline{BLa}$ occurs. At this time, the enable signal is applied to the sense amplifier 22 through the enable signal line SE to make the sense amplifier 22 active. In general, the pairs of bit lines BLa and $\overline{BLa}$ are precharged to one-half a power source voltage Vcc in order to reduce the power consumption due to a current flowing from a power source to bit lines. Therefore, the sense amplifier 22 senses and amplifies difference in potential between the pair of bit lines BLa and $\overline{BLa}$ which are precharged to Vcc/2. Thereafter, the transfer gate TGb is turned on and the difference voltage amplified by the sense amplifier 22 is transferred to the bit lines BLb and $\overline{BLb}$. Then, the transferred difference voltage is fed to the data bus 20 through the I/O gate (not shown in FIG. 2).

As described in the foregoing, the present invention mainly intends to use a CMOS sense amplifier positioned between the pair of bit lines BLa and $\overline{BLa}$ and the pair of bit lines BLb and $\overline{BLb}$. For this purpose, it is assumed that in the arrangement shown in FIG. 2, a CMOS sense amplifier is employed in place of the sense amplifier 22 formed with the n-channel transistors. With this assumption, the read-out operation mentioned above is considered. The CMOS sense amplifier is coupled to the pair of bit lines BLa and $\overline{BLa}$ through the transfer gate TGa, during the amplifying operation. These bit lines BLa and $\overline{BLa}$ acts as a capacitive load (parasitic capacitance) on the CMOS sense amplifier. Therefore, the CMOS sense amplifier must charge up and discharge the parasitic capacitance to extend the difference in potential between the bit lines BLa and $\overline{BLa}$ from the precharged level Vcc/2. Therefore, a considerable amount of time is required until the CMOS sense amplifier has sufficiently amplified the difference in potential. In the amplifying operation, the CMOS sense amplifier increases the potential of the bit line which is higher than that of the other bit line, from Vcc/2 to Vcc, and decreases the potential of the other line from Vcc/2 to Vss (ground potential). For example, when a memory cell connected to the bit line BLa has a data "1", the bit line $\overline{BLa}$ is increased from Vcc/2 to Vcc, whereas the bit line BLa is decreased from Vcc/2 to Vss. It should be noted that in this state, a large amount of a through current continues to flow from the power source into the CMOS sense amplifier until the bit line at the higher potential (BLa in the above example) is sufficiently charged up to Vcc. As a result, the power consumed in the CMOS sense amplifier is extremely large.

The present invention intends to provide a semiconductor memory device of low power consumption in which CMOS transistors are used to form a sense amplifier arranged at each of divided points. According to the present invention, in order to reduce the power consumption in the CMOS sense amplifier, control timing of transfer gates is improved.

A description will now be given of an embodiment of a semiconductor memory device according to the present invention.

Figure 4:
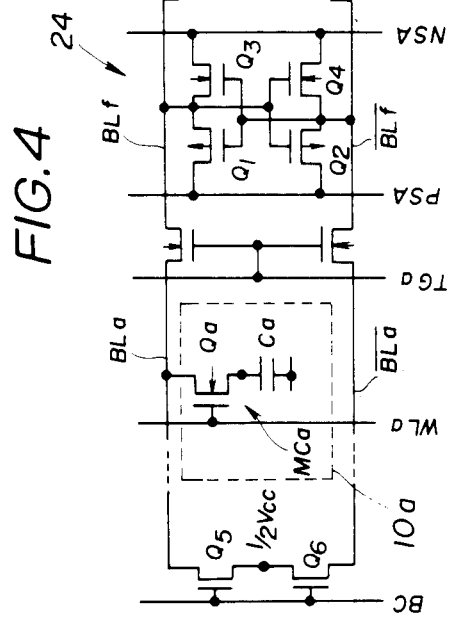
FIG. 4 is a circuit diagram of a configuration associated with one pair of a plurality of pairs of bit lines in a semiconductor memory device of an embodiment according to the present invention.

FIG. 4 illustrates a configuration associated with one pair of a plurality of pairs of bit lines in a semiconductor memory device according to the present invention. A block outline of this embodiment is the same as that shown in FIG. 1B. Referring to FIG. 4, a pair of bit lines BL and $\overline{BL}$ are divided into two parts, one of which is a pair of bit lines BLa and $\overline{BLa}$, and the other is a pair of bit lines BLb and $\overline{BLb}$. A sense amplifier 24 is provided at the divided point. The sense amplifier 24 is formed with CMOS transistors. In detail, the sense amplifier 24 is a latch circuit (flip-flop) made up of two p-channel MOS transistors $Q_1$ and $Q_2$ and two n-channel MOS transistors $Q_3$ and $Q_4$. An inverter composed of the transistors $Q_1$ and $Q_3$ and an inverter composed of the transistors $Q_2$ and $Q_4$ are respectively coupled between a high potential side power source line PSA and a low potential side power source line NSA. The common gate electrode of the former is connected to a bit line $\overline{BLf}$ and that of the latter is connected to a bit line BLf. BLf and $\overline{BLf}$ denote bit lines provided between the transfer gates TGa and TGb. The power source lines PSA and NSA are held at one-half a power source voltage Vcc while the sense amplifier 24 is disabled. While the sense amplifier 24 is enabled, the lines PSA and NSA are respectively held at Vcc and Vss. The sense amplifier 24 in the enabled state operates as follows. When the level of the bit line BLa is slightly higher than that of the bit line $\overline{BLa}$, for example, the transistors $Q_1$ and $Q_4$ begin operating toward the on-state, whereas the transistors $Q_2$ and $Q_3$ begin operating toward the off-state. Then, when the transistors $Q_1$ and $Q_4$ totally reach to the on-state and also the transistors $Q_2$ and $Q_3$ totally reach to the off-state, the bit lines BLa and $\overline{BLa}$ are set to approximately Vcc and Vss, respectively. In fact, since storage data "1" and "0" in the memory cell respectively correspond to Vcc-$V_{THN}$ ($V_{THN}$ is a threshold voltage of the MOS transistor of the memory cell) and Vss, the potentials of the bit lines BLa and $\overline{BLa}$ are respectively Vcc-$V_{THN}$ and Vcc.

One pair of transfer gates are arranged on both the sides of the sense amplifier 24. The transfer gate TGa is provided between the sense amplifier 24 and the pair of bit lines BLa and $\overline{BLa}$. Similarly, a transfer gate TGb is arranged between the sense amplifier 24 and the pair of bit lines BLb and $\overline{BLb}$. The transfer gates are controlled by a control timing generator (not shown). A cell array 10a is coupled to the bit lines BLa and $\overline{BLa}$. The cell array 10a includes a plurality of memory cells, each of which is connected to either bit line BLa or $\overline{BLa}$. In FIG. 4, only one memory cell MCa consisting of a transistor Qa and a capacitor Ca is illustrated. Similarly, a cell array 10b is coupled to the bit lines BLb and BLb. Although the cell array 10b includes a plurality of memory cells, each of which is coupled to either bit line BLb or $\overline{BLb}$, there is illustrated only one memory cell MCb consisting of a transistor Qb and a capacitor Cb in FIG. 4.

In order to reduce the power consumption of the DRAM, the bit lines BLa and $\overline{BLa}$ are respectively precharged to Vcc/2 by transistors $Q_5$ and $Q_6$. Before the read-out operation, or in the stand-by mode, the potential of a line BC is increased to Vcc, and the potentials of the bit lines BLa and $\overline{BLa}$ are respectively increased to Vcc/2. Similarly, the bit lines BLb and $\overline{BLb}$ are respectively precharged to Vcc/2 by transistors (not shown) coupled therebetween. The bit lines BLb and $\overline{BLb}$ are respectively connected to data buses DB and $\overline{DB}$ through I/O gate 18i.

A description will be given of a read-out operation of the circuit shown in FIG. 4 by referring to FIGS. 4, 5A and 5B.

Figure 5A:
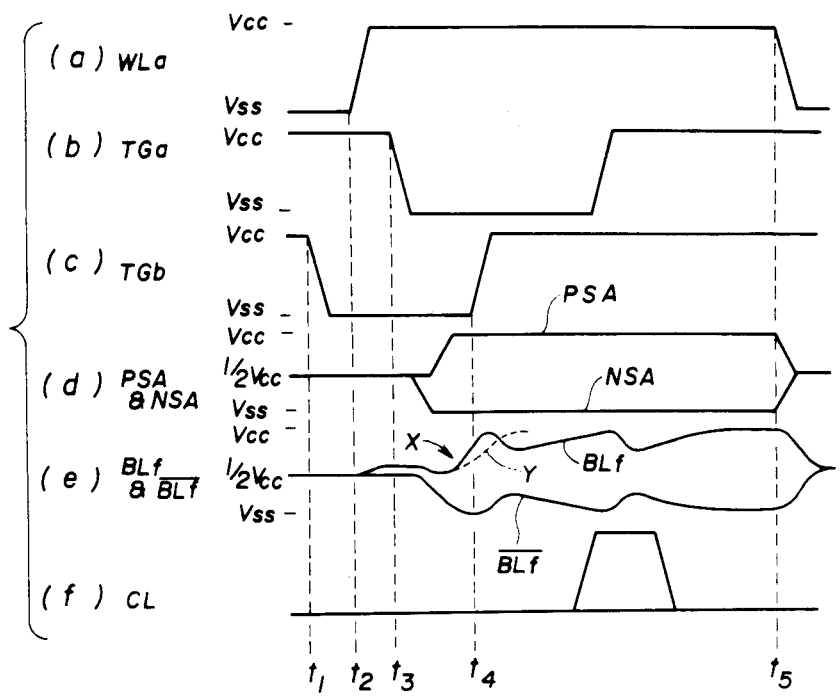
FIGS. 5A and 5B are respectively views showing signal waveforms at parts of the circuit shown in FIG. 4.

FIG. 5A shows signal waveforms at part of the circuit in FIG. 4, when one of memory cells in the cell array 10a is selected. It is assumed that a memory cell MCa in the cell array 10a is selected and has a storage datum "1". Initially, the transfer gates TGa and TGb are set to the on- and off-states, respectively. When the memory cell MCa is selected, the transfer gate TGb is first turned off (at time $t_1$ in FIG. 5A). In this state, the potential of the word line WLa is made high to turn on the transistor Qa of the memory cell MCa (at time $t_2$). The charge stored in the cell capacitor Ca begins flowing out to the bit line BLa through the transistor Qa. Thereby, a small difference in potential between the bit lines BLa and $\overline{BLa}$ occurs. The potential difference is applied to the pair of input terminals of the sense amplifier 24 through the transfer gate TGa. Next, the transfer gate TGa is turned off (at time $t_3$). Therefore, the sense amplifier 24 is enabled by decreasing the potential of the line NSA to Vss and then increasing the potential of the line PSA to Vcc. The transistors $Q_1$ and $Q_4$ of the sense amplifier 24 begin operating toward the on-state, and the transistors $Q_2$ and $Q_3$ begin operating toward the off-state, since the potential of the bit line BLf (BLa) is slightly larger than that of the bit line $\overline{BLf}$ ($\overline{BLa}$). At this time, since both the transfer gates TGa and TGb are held in the off-state, the sense amplifier 24 is disconnected from the bit lines BLa, $\overline{BLa}$, BLb and $\overline{BLb}$. In other words, no capacitive load is coupled to the sense amplifier 24. Therefore, the potential of the bit line BLf is rapidly increased to Vcc, as indicated by a character X. Consequently, the sense amplifier 24 can rapidly amplify the difference voltage between the bit lines BLf and $\overline{BLf}$. Hence, the power consumption of the sense amplifier 24 due to the through current flowing from the line PSA to the line NSA through the transistors $Q_1$ and $Q_2$ can be greatly reduced. It should be noted that if the sense amplifier 24 is coupled to the bit lines BLa and $\overline{BLa}$ during the amplifying operation, the time required for charging up the bit line BLa to Vcc will be lengthened due to the parasitic capacitance thereof, as indicated by a dotted line Y. In the above assumption, a large amount of the current flows through the transistors $Q_1$ and $Q_3$ and therefore the power consumed therein becomes extremely large.

After the sense amplifier 24 has sufficiently amplified the datum of the memory cell MCa, the transfer gate TGb is turned on (at time $t_4$). Then, the sense amplifier 24 transfers its output to the bit lines BLb and $\overline{BLb}$. Next, the I/O gate 18i is turned on in response to the signal CL illustrated in FIG. 5A, and the output of the sense amplifier 24 is transmitted to the pair of the data buses DB and $\overline{DB}$. At the same time, the transfer gate TGa is turned on, and the potentials of the bit lines BLa and $\overline{BLa}$ are changed in accordance with the datum latched by the sense amplifier 24, so that the memory cell MCa belonging to the word line WLa is refreshed. Then, the word line WLa is decreased to Vss (at time $t_5$).

Figure 5B:
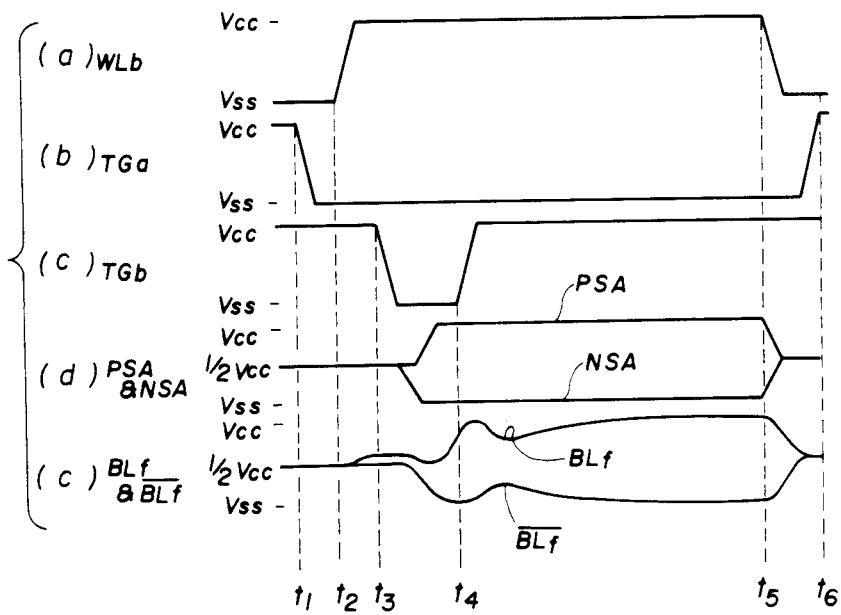

Referring to FIG. 5B, when selecting the memory cell MCb in the cell array 10b, the transfer gate TGa is turned off (at time $t_1$ in FIG. 5B). At this time, the transfer gate TGb is in the on-state. Then, the word line WLb is increased to Vcc (at time $t_2$), so that the difference in potential between the bit lines BLb (BLf) and $\overline{BLb}$ (BLf) occurs. This potential difference is sent to the pair of input terminals of the sense amplifier 24 through the transfer gate TGb. Next, the transfer gate TGb is turned off (at time $t_3$). Then, the line NSA is decreased to Vss and the line PSA is increased to Vcc. Therefore, the sense amplifier 24 is activated and amplifies the potential difference in such a state that no capacitive load is coupled thereto. After that, the transfer gate TGb is turned on (at time $t_4$) and the bit lines BLb and $\overline{BLb}$ are driven by the sense amplifier 24. Then, the word line WLb is decreased to Vss (at time $t_5$) and simultaneously the lines PSA and NSA are set to Vcc/2. Then the transfer gate TGa is turned on. Hence, the bit lines BLa, $\overline{BLa}$, BLb and $\overline{BLb}$ are reset.

Other memory cells in the cell array 10a or 10b or memory cells associated to pairs of bit lines other than bit lines in FIG. 4 may be read out in the similar manner to the above-mentioned read-out operation.

The writing operation of data may be carried out in the similar way to that in the conventional configuration.

A description will now be given of another embodiment of a semiconductor device according to the present invention with reference to FIGS. 6 and 7. This embodiment is one example of where bit lines are divided into three parts.

Figure 6:
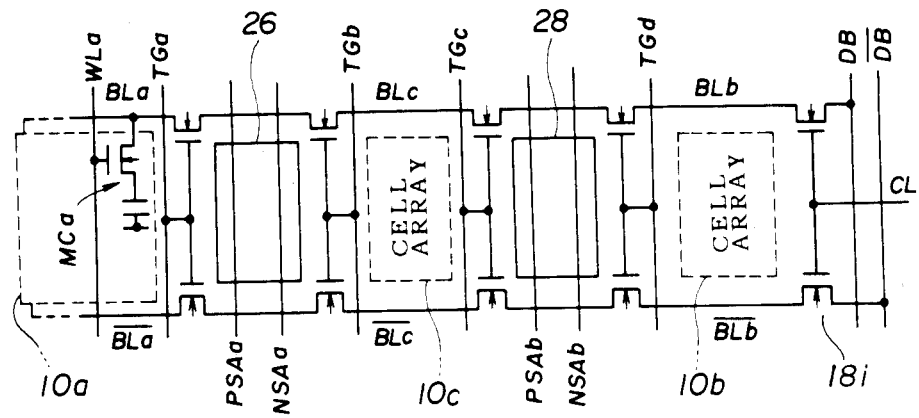
FIG. 6 is a circuit diagram of a configuration associated with one pair of a plurality of pairs of bit lines in a semiconductor memory device of another embodiment according to the present invention.

As shown in FIG. 6, the pair of bit lines BL and $\overline{BL}$ are divided into a pair of bit lines BLa and $\overline{BLa}$, a pair of bit lines BLb and $\overline{BLb}$, and a pair of bit lines BLc and $\overline{BLc}$. At each of the divided points, there are respectively provided sense amplifiers 26 and 28. Correspondingly, the cell array associated to the bit lines BL and $\overline{BL}$ is divided into three cell arrays 10a, 10b and 10c. Transfer gates TGa and TGb are provided between the pair of bit lines BLa and $\overline{BLa}$ and the pair of bit lines BLc and $\overline{BLc}$. Likewise, transfer gates TGc and TGd are provided between the pair of bit lines BLc and $\overline{BLc}$ and the pair of bit lines BLb and $\overline{BLb}$. The bit lines BLb and $\overline{BLb}$ are respectively coupled to data buses DB and $\overline{DB}$ through the I/O gate 18i. In FIG. 6, only one memory cell MCa of many memory cells in the cell array 10 is illustrated together with its word line WLa. Memory cells and their word lines relative to each of the cell arrays 10b and 10c are omitted for simplicity. Each of the sense amplifiers 26 and 28 is configured by CMOS transistors in the same way as the sense amplifier 24 shown in FIG. 4. The pairs of bit lines are respectively precharged to Vcc/2 by means of transistors (not shown) provided in each bit line pair.

Figure 7:
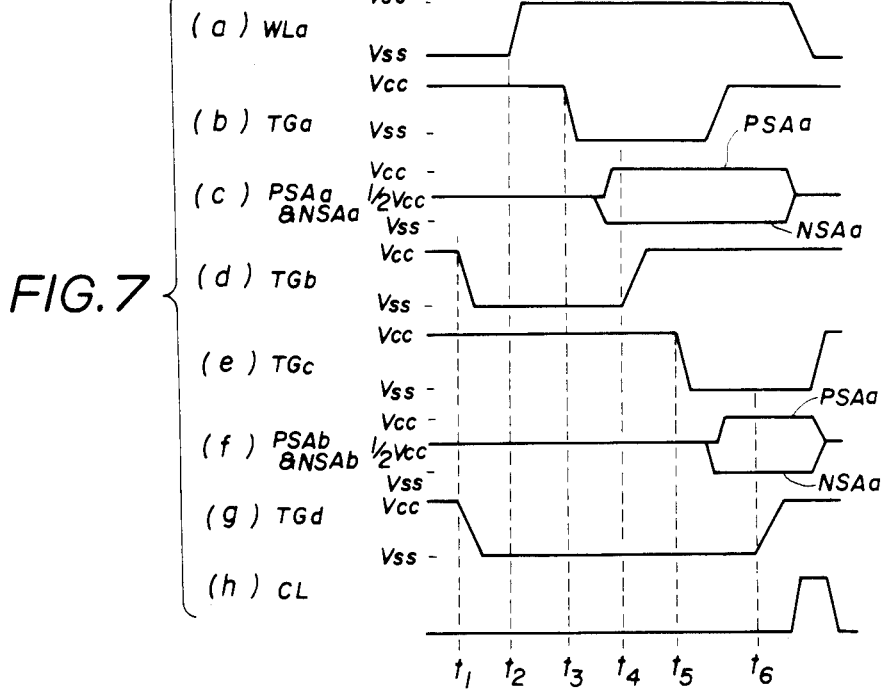
FIG. 7 is a view showing signal waveforms at parts of the circuit shown in FIG. 6.

When reading out a datum stored in the memory cell MCa in the cell array 10a, the transfer gate TGb is turned off (at time $t_1$ in FIG. 7). At this time, the transfer gate TGa is held in the on-state. Then, the word line WLa is increased to Vcc (at time $t_2$), so that the potential difference occurs between the bit lines BLa and $\overline{BLa}$ and is transferred to the sense amplifier 26. Next, the transfer gate TGa is turned off (at time $t_3$). In this state, the lines NSAa and PSAa of the sense amplifier 26 are respectively set to Vss and Vcc in this sequence, so that the sense amplifier 26 begins amplifying the potential difference in a state such that no capacitive load is coupled thereto. When the sense amplifier 26 has latched the potential difference, the transfer gate TGb is turned on (at time $t_4$). At this time, since the transfer gate TGc is held in the on-state, the potential difference latched by the sense amplifier 26 is transferred to the sense amplifier 28 via the transfer gates TGb and TGc. Then, the transfer gate TGc is turned off (at time $t_5$) and then the lines NSAb and PSAb of the sense amplifier 28 are respectively set to Vss and Vcc in this sequence, so that the sense amplifier 28 is activated. At this time, both the transfer gates TGc and TGd are held in the off state. Therefore, the sense amplifier 28 amplifies the transmitted potential difference without the capacitive load coupled thereto. Then, the transfer gate TGd is turned on and then the I/O gate 18i is also turned on by the application of the signal CL, so that the potential difference is sent to the data buses DB and $\overline{DB}$.

As described in the foregoing, the sense amplifiers 26 and 28 amplify the potential difference in a state that no capacitive load is coupled thereto. Therefore, it is possible to obtain a semiconductor memory device in which the power consumption of the CMOS sense amplifier is extremely small. In addition, it is effective against noise due to the adjacent bit lines, because the sense amplifier is disconnected during sensing.

The present invention is not limited to the embodiments, but various variation and modification may be made without departing from the scope of the present invention. For example, configurations such that bit lines are divided to four bit line parts or more are within the scope of the present invention. Further, although the line PSA is driven toward Vcc after the line NSA is driven toward Vss, it is possible to increase the potential of the line PSA from Vcc/2 to Vcc in advance.

What is claimed is:

1. A semiconductor memory device comprising:
   a memory cell array comprising memory cells;
   a plurality of pairs of bit lines which are coupled to the memory cells and a data bus, each bit line being divided into at least two pairs of bit line parts;
   at least one sense amplifier provided between said pairs of bit line parts in each of said pairs of bit lines, for sensing a difference in potential between bit line pairs in each pair, said sense amplifier being formed with complementary metal oxide semiconductor transistors; and
   at least one pair of transfer gates provided between a non-data bus side and a data bus side of said sense amplifier;

wherein when a memory cell is selected, the transfer gate positioned on the side opposite to the selected memory cell is turned off in a state where the other transfer gate positioned on the same side as the selected memory cell is held in the on-state so that the difference in potential occurs between the pair of bit line parts on the same side as the selected memory cell, and thereafter the transfer gate positioned on the same side as the selected memory cell is turned off and the sense amplifier is activated, and wherein after the sense amplifier latches the difference in potential due to a datum stored in said selected memory cell, the transfer gate on the data bus side is turned on in a state where the transfer gate on the non-data bus side is held in the off-state, and thereafter the transfer gate on the non-data bus side is turned on.

2. A semiconductor memory device as claimed in claim 1, wherein said sense amplifier is a latch circuit made up of two p-channel metal oxide semiconductor transistors and two n-channel metal oxide semiconductor transistors.

3. A semiconductor memory device as claimed in claim 2, wherein said latch circuit has two inverters, each of which is formed by one p-channel transistor and one n-channel transistor and wherein common gates of said inverters are input terminals of said latch circuit.

4. A semiconductor memory device as claimed in claim 3, wherein said inverters are respectively connected between a high potential power source line and a low potential power source line.

5. A semiconductor memory device as claimed in claim 4, wherein the potential of said high potential power source line is increased to a power source voltage and the potential of said low potential power source line is decreased to a ground voltage, when activating said sense amplifier.

6. A semiconductor memory device as claimed in claim 1, wherein said pairs of bit line parts are respectively precharged to half of the power source voltage.

* * * * *